(12) United States Patent
Choi et al.

(10) Patent No.: US 12,044,744 B2
(45) Date of Patent: Jul. 23, 2024

(54) APPARATUS AND METHOD FOR DIAGNOSING STATE OF BATTERY

(71) Applicant: LG Energy Solution, Ltd., Seoul (KR)

(72) Inventors: Hyun-Jun Choi, Daejeon (KR); Young-Deok Kim, Daejeon (KR); Dae-Soo Kim, Daejeon (KR); Su-Won Jee, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 167 days.

(21) Appl. No.: 17/766,778

(22) PCT Filed: Apr. 29, 2021

(86) PCT No.: PCT/KR2021/005493
§ 371 (c)(1),
(2) Date: Apr. 6, 2022

(87) PCT Pub. No.: WO2021/246655
PCT Pub. Date: Dec. 9, 2021

(65) Prior Publication Data
US 2023/0333174 A1 Oct. 19, 2023

(30) Foreign Application Priority Data
Jun. 3, 2020 (KR) ........................ 10-2020-0067296

(51) Int. Cl.
G01R 31/392 (2019.01)
G01R 31/3842 (2019.01)

(52) U.S. Cl.
CPC ....... G01R 31/392 (2019.01); G01R 31/3842 (2019.01)

(58) Field of Classification Search
None
See application file for complete search history.

(56) References Cited

U.S. PATENT DOCUMENTS

2010/0233546 A1 9/2010 Nesper et al.
2013/0119940 A1 5/2013 Iriyama et al.
(Continued)

FOREIGN PATENT DOCUMENTS

CN 103053066 A 4/2013
CN 103698714 A 4/2014
(Continued)

OTHER PUBLICATIONS

Berecibar, M. et al., "Online state of health estimation on NMC cells based on predictive analytics" Elsevier, Amsterdam, NL, Journal of Power Sources, Apr. 2016, pp. 239-250, vol. 320.
(Continued)

Primary Examiner — Jas A Sanghera
(74) Attorney, Agent, or Firm — Lerner David LLP

(57) ABSTRACT

An apparatus and method for diagnosing a state of a battery in various aspects based on a differential profile respectively obtained in a situation where the battery is charged and discharged. Since the state of the battery is diagnosed by considering both the first differential profile related to the charging of the battery and the second differential profile related to the discharging of the battery, there is an advantage of diagnosing the state of the battery more accurately.

13 Claims, 11 Drawing Sheets

(56) References Cited

U.S. PATENT DOCUMENTS

| | | | |
|---|---|---|---|
| 2013/0335009 A1* | 12/2013 | Katsumata | G01R 31/3842 702/63 |
| 2015/0200425 A1 | 7/2015 | Iriyama et al. | |
| 2016/0061908 A1 | 3/2016 | Torai et al. | |
| 2016/0190658 A1 | 6/2016 | Ishibashi et al. | |
| 2019/0383878 A1* | 12/2019 | Coenen | H02J 7/0048 |
| 2020/0182938 A1 | 6/2020 | Ukumori et al. | |
| 2020/0212511 A1 | 7/2020 | Adachi et al. | |
| 2020/0225292 A1 | 7/2020 | Ukumori et al. | |
| 2021/0046844 A1 | 2/2021 | Bae et al. | |

FOREIGN PATENT DOCUMENTS

| | | |
|---|---|---|
| CN | 110794316 A | 2/2020 |
| CN | 111194412 A | 5/2020 |
| JP | 2013019709 A | 1/2013 |
| JP | 5354416 B1 | 11/2013 |
| JP | 5397679 B2 | 1/2014 |
| JP | 2014092471 A | 5/2014 |
| JP | 2014139897 A | 7/2014 |
| JP | 5662968 B2 | 2/2015 |
| JP | 2016053564 A | 4/2016 |
| JP | 6225340 B2 | 11/2017 |
| JP | 2019050151 A | 3/2019 |
| JP | 2019078771 A | 5/2019 |
| JP | 2019113558 A | 7/2019 |
| KR | 20190118529 A | 10/2019 |
| WO | 2013-157132 A1 | 10/2013 |

OTHER PUBLICATIONS

Liu, J. et al., "Aging mechanisms and thermal stability of aged commercial18650 lithiumion battery induced by slight overcharging cycling" Elsevier, Amsterdam, NL, Journal of Power Sources, Oct. 2019, pp. 1-9, vol. 445.

Liu, Y. et al., "Cobalt-Free Core-Shell Structure with High Specific Capacity and Long Cycle Life as an Alternative to Li[Nio.8Mno.1CO0.1]O2" Journal of The Electrochemical Society, Open Access, Sep. 2020, pp. 1-9, vol. 167.

Wang, Y. et al., Influence of Li substitution on the structure and electrochemical performance of P2-type Na0 .67Ni0 .2Fe0 .15Mn0 .65O 2 cathode materials for sodium ion batteries Elsevier, Amsterdam, NL, Journal of Power Sources, Aug. 2018, pp. 639-647, vol. 396.

Wu, Y. et al., "State of Health 1-13 Estimation for Lithium-Ion Batteries Based on Healthy Features and Long Short-Term Memory" IEEE Acess, USA, Feb. 2020, pp. 28533-28547, vol. 8.

Extended European Search Report including Written Opinion for Application No. 21818195.6 dated Jul. 10, 2023, pp. 1-11.

International Search Report Application No. PCT/KR2021/005493, mailed Aug. 24, 2021, pp. 1-3.

* cited by examiner

APPARATUS AND METHOD FOR DIAGNOSING STATE OF BATTERY

CROSS-REFERENCE TO RELATED APPLICATIONS

The present application is a national phase entry under 35 U.S.C. § 371 of International Application No. PCT/KR2021/005493 filed Apr. 29, 2021, published in Korean, which claims priority from Korean Patent Application No. 10-2020-0067296 filed Jun. 3, 2020, all of which are incorporated herein by reference.

TECHNICAL FIELD

The present disclosure relates to an apparatus and method for diagnosing a state of a battery, and more particularly, to an apparatus and method for diagnosing a state of a battery based on a battery profile.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel-hydrogen batteries, nickel-zinc batteries, lithium batteries and the like. Among them, the lithium batteries are in the limelight since they have almost no memory effect compared to nickel-based batteries and also have very low self-discharging rate and high energy density.

However, a battery may be degraded through repeated charging or discharging. For example, at a positive electrode of the battery, the electrolyte may be oxidized or the crystal structure may be destroyed, thereby degrading the battery. At a negative electrode, metallic lithium may be precipitated to degrade the battery. Therefore, conventionally, the degradation of a battery is diagnosed based on a battery profile obtained while the battery is being charged.

FIG. 1 is a diagram schematically showing an example of a battery profile. FIG. 2 is a diagram schematically showing an example of a battery differential profile.

Specifically, FIG. 1 is a diagram showing a battery profile based on voltage (V) and capacity (Q) of a battery. FIG. 2 is a differential profile based on the battery profile of FIG. 1 and is a diagram showing a differential profile for voltage (V) and differential capacity (dQ/dV) of a battery.

For example, at a point a in the battery profile of FIG. 1, the voltage value may be Va [V], and the capacity value may be Qa [mAh].

The differential profile of FIG. 2 may include a plurality of peaks. For example, the differential profile of FIG. 2 may include a first peak p1, a second peak p2, a third peak p3, and a fourth peak p4. In addition, the first peak p1, the second peak p2, the third peak p3, and the fourth peak p4 of FIG. 2 may be peaks corresponding to a point a, a point b, a point c, and a point d of FIG. 1, respectively.

Conventionally, the state of a battery is diagnosed based on the behavior of a peak included in the differential profile of a battery. However, conventionally, the state of the battery is diagnosed using a charging profile (a profile obtained in a charging process) or a discharging profile (a profile obtained in a discharging process), or it is limitedly diagnosed whether the battery has positive electrode degradation or negative electrode degradation for each peak.

Therefore, it is necessary to develop a technology for diagnosing a state of a battery from various aspects more accurately, based on the behavior of a peak included in a differential profile of the battery.

SUMMARY

Technical Problem

The present disclosure is designed to solve the problems of the related art, and therefore the present disclosure is directed to providing an apparatus and method for diagnosing a state of a battery in various aspects based on a differential profile respectively obtained in a situation where the battery is charged and discharged.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for diagnosing a state of a battery, comprising: a control unit configured to: receive a first differential profile converted from a first profile for voltage and capacity of a battery while the battery is being charged; receive a second differential profile converted from a second profile for voltage and capacity of the battery while the battery is being discharged; determine a first target peak from among a first plurality of peaks included in the first differential profile; diagnose a first indication of the state of the battery according to a first comparison result between the determined first target peak and a preset first reference peak; determine a second target peak from among a second plurality of peaks included in the second differential profile; diagnose a second indication of the state of the battery according to a second comparison result between the determined second target peak and a preset second reference peak; and diagnose the state of the battery based on at least one of the diagnosed first indication or the diagnosed second indication.

The control unit may be configured to: diagnose the first indication of the state of the battery as a pending state or a negative electrode degraded state, and diagnose the second indication of the state of the battery as any one of a normal state, a positive electrode degraded state or a negative electrode degraded state.

The control unit may be configured to diagnose the second state, in response to the diagnosed first indication of the state of the battery being the pending state.

The control unit may be configured to: set a predetermined reference voltage based on a voltage value of the first reference peak, diagnose the first indication of the state of the battery as the negative electrode degraded state, in response to the voltage value of the first target peak being greater than the reference voltage, and diagnose the first indication of the state of the battery as the pending state, in response to the voltage value of the first target peak being equal to or smaller than the reference voltage.

The control unit may be configured to: set a predetermined reference region based on a voltage value of the second reference peak, diagnose the second indication of the state of the battery as the negative electrode degraded state, in response to a voltage value of the second target peak being greater than an upper limit of the reference region, diagnose the second indication of the state of the battery as the positive electrode degraded state, in response to the voltage value of the second target peak being smaller than a lower limit of the reference region, and diagnose the second indication of the state of the battery as the normal state, in response to the voltage value of the second target peak falling within the reference region.

The control unit may be configured to: set a predetermined differential capacity region based on a differential capacity value of the second reference peak, diagnose the second indication of the state of the battery as the negative electrode degraded state, in response to the voltage value of the second target peak being greater than the upper limit of the reference region and the differential capacity value of the second target peak being smaller than a lower limit of the differential capacity region, diagnose the second indication of the state of the battery as the positive electrode degraded state, in response to the voltage value of the second target peak being smaller than the lower limit of the reference region and the differential capacity value of the second target peak being greater than an upper limit of the differential capacity region, and diagnose the second indication of the state of the battery as the normal state, in response to the voltage value of the second target peak falling within the reference region and the differential capacity value of the second target peak falling within the differential capacity region.

An apparatus for diagnosing a state of a battery according to another aspect of the present disclosure may further comprise memory configured to store a plurality of first differential profiles and a plurality of second differential profiles converted from the plurality of first profiles and the plurality of second profiles, respectively, at a plurality of cycles.

The control unit may be configured to: determine a respective first target peak for each of the plurality of first differential profiles stored in the memory; diagnose a third indication of the state of the battery based on a change of voltage of the plurality of determined first target peaks at each cycle; determine a respective second target peak for each of the plurality of second differential profiles stored in the memory; diagnose a fourth indication of the state of the battery based on a change of voltage and a change of differential capacity of the plurality of determined second target peaks at each cycle; and diagnose a degradation accelerated state of the battery based on at least one of the diagnosed third indication or the diagnosed fourth indication.

The control unit may be configured to: diagnose the third indication of the state of the battery as a pending state or a negative electrode degradation accelerated state, and diagnose the fourth indication of the state of the battery as any one of a normal state, a positive electrode degradation accelerated state or the negative electrode degradation accelerated state.

The control unit may be configured to: diagnose the third indication of the state of the battery as the negative electrode degradation accelerated state, in response to a voltage at each of the plurality of first target peaks increasing.

The control unit may be configured to: diagnose the fourth indication of the state of the battery of the battery, in response to the diagnosed third indication of the state of the battery being the pending state.

The control unit may be configured to: diagnose the fourth indication of the state of the battery as the negative electrode degradation accelerated state, in response to a voltage value of each of the plurality of second target peaks increasing and the differential capacity value of each of the plurality of second target peaks decreasing, and diagnose the fourth indication of the state of the battery as the positive electrode degradation accelerated state, in response to the voltage value of each of the plurality of second target peaks decreasing and the differential capacity value of each of the plurality of second target peaks increasing.

In still another aspect of the present disclosure, there is also provided a battery pack, comprising the apparatus for diagnosing a state of a battery according to any of the embodiments of the present disclosure described herein.

In still another aspect of the present disclosure, there is also provided a method for diagnosing a state of a battery, comprising: obtaining a first profile for voltage and capacity of the battery while the battery is being charged; obtaining a second profile for voltage and capacity of the battery while the battery is being discharged; converting the first profile into a first differential profile for voltage and differential capacity of the battery; converting the second profile into a second differential profile for voltage and differential capacity of the battery; determining a first target peak from among a plurality of peaks included in the first differential profile; diagnosing a first indication of the state of the battery according to a first comparison result between the determined first target peak and a preset first reference peak; determining a second target peak among a plurality of peaks included in the second differential profile; diagnosing a second indication of the state of the battery according to a second comparison result between the determined second target peak and a preset second reference peak; and diagnosing the state of the battery by using at least one of the diagnosed first indication of the state of the battery and the diagnosed second indication of the state of the battery.

Advantageous Effects

According to one aspect of the present disclosure, since the state of the battery is diagnosed by considering both the first differential profile related to the charging of the battery and the second differential profile related to the discharging of the battery, there is an advantage of diagnosing the state of the battery more accurately.

In addition, according to one aspect of the present disclosure, there is an advantage of not only diagnosing whether the battery is degraded but also tracking and diagnosing whether the degradation of the battery is accelerated according to the charge/discharge cycle.

The effects of the present disclosure are not limited to the above, and other effects not mentioned herein will be clearly understood by those skilled in the art from the appended claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 3:
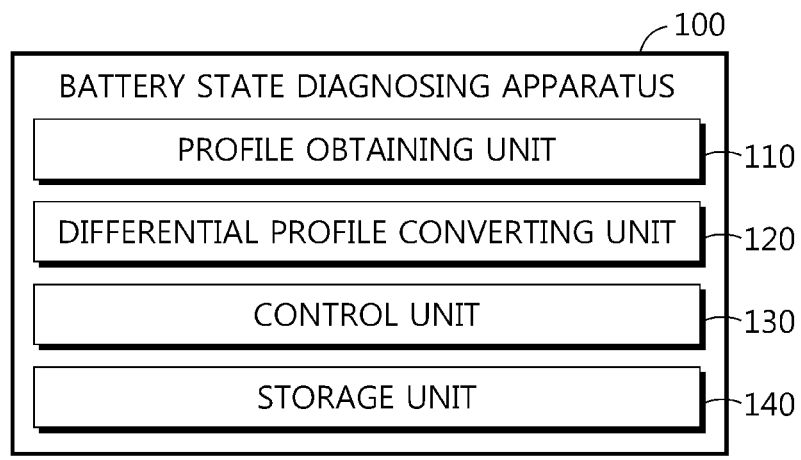
FIG. 3 is a diagram schematically showing an apparatus for diagnosing a state of a battery according to an embodiment of the present disclosure.

FIG. 3 is a diagram schematically showing an apparatus 100 for diagnosing a state of a battery according to an embodiment of the present disclosure.

Referring to FIG. 3, the apparatus 100 for diagnosing a state of a battery according to an embodiment of the present disclosure may include a profile obtaining unit 110, a differential profile converting unit 120 and a control unit 130.

Here, the battery may include a battery cell or a battery module. Specifically, the battery cell refers to one independent battery cell that includes a negative electrode terminal and a positive electrode terminal and is physically separable. For example, one pouch-type lithium polymer cell may be regarded as the battery cell. Also, the battery module may refer to a cell assembly in which one or more battery cells are connected in series and/or in parallel.

The profile obtaining unit 110 may be configured to obtain a first profile for voltage and capacity of a battery while the battery is being charged. In addition, the profile obtaining unit 110 may be configured to obtain a second profile for voltage and capacity of the battery while the battery is being discharged.

For example, the first profile is a profile based on the voltage and current of the battery obtained while the battery is being charged, and may be a battery profile for voltage and capacity of the battery. The second profile is a profile based on the voltage and current of the battery obtained while the battery is being discharged, and may be a battery profile for voltage and capacity of the battery.

The differential profile converting unit 120 may be configured to receive the first profile and the second profile from the profile obtaining unit 110.

For example, the differential profile converting unit 120 and the profile obtaining unit 110 may be connected to communicate with each other. In addition, the differential profile converting unit 120 may receive the first profile and the second profile from the profile obtaining unit 110.

The differential profile converting unit 120 may be configured to convert the first profile and the second profile into a first differential profile and a second differential profile for voltage and differential capacity of the battery, respectively.

Specifically, the differential profile converting unit 120 may convert the first profile for voltage and capacity of the battery to obtain a first differential profile for voltage and differential capacity (dQ/dV) of the battery. In addition, the differential profile converting unit 120 may convert the second profile for voltage and capacity of the battery to obtain a second differential profile for voltage and differential capacity of the battery.

An example of the differential profile converted by the differential profile converting unit 120 will be described with reference to FIGS. 4 to 6.

Figure 4:
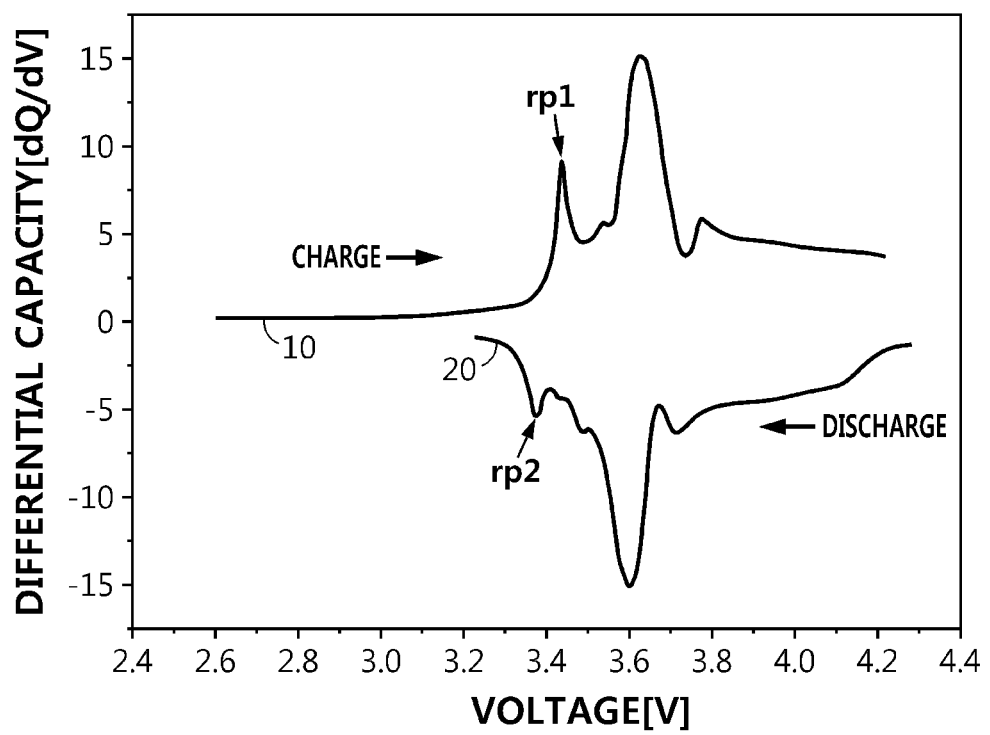
FIG. 4 is a diagram schematically showing a reference profile obtained by the apparatus for diagnosing a state of a battery according to an embodiment of the present disclosure.

FIG. 4 is a diagram schematically showing a reference profile obtained by the apparatus 100 for diagnosing a state of a battery according to an embodiment of the present disclosure. FIG. 5 is a diagram schematically showing a first reference profile 10 and a first differential profile 11 of a first battery, obtained by the apparatus 100 for diagnosing a state of a battery according to an embodiment of the present disclosure. FIG. 6 is a diagram schematically showing a second reference profile 20 and a second differential profile 21 of the first battery, obtained by the apparatus 100 for diagnosing a state of a battery according to an embodiment of the present disclosure.

Figure 5:
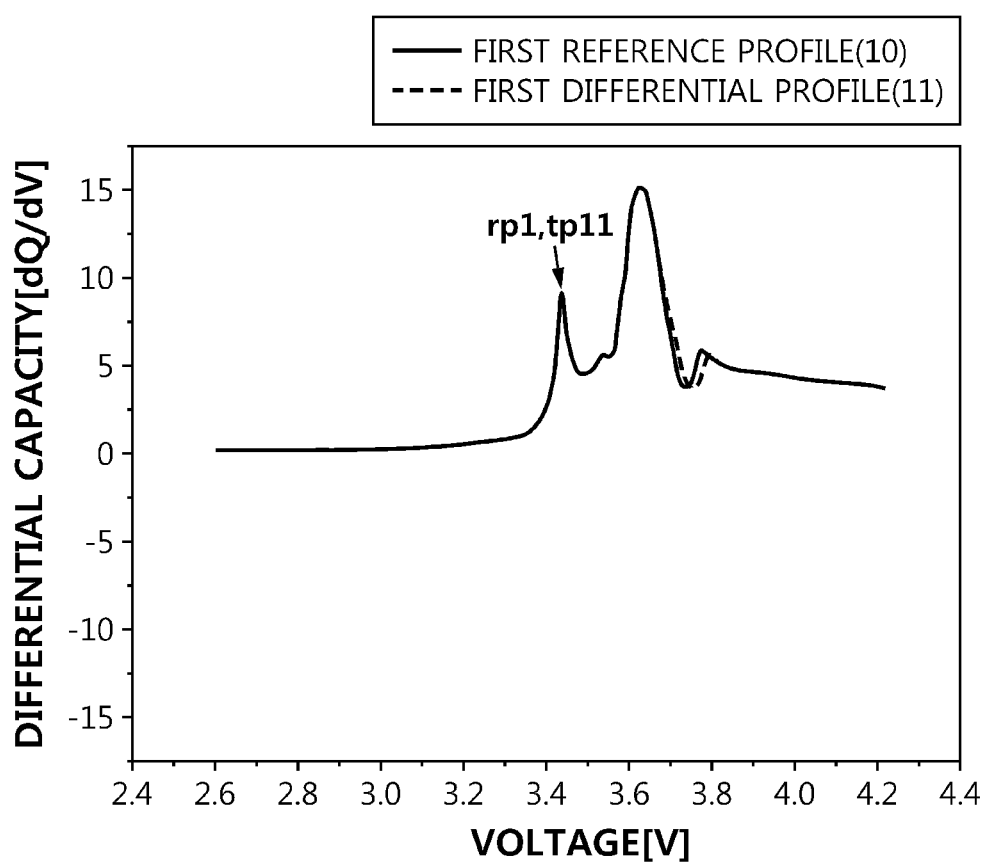
FIG. 5 is a diagram schematically showing a first reference profile and a first differential profile of a first battery, obtained by the apparatus for diagnosing a state of a battery according to an embodiment of the present disclosure.
Figure 6:
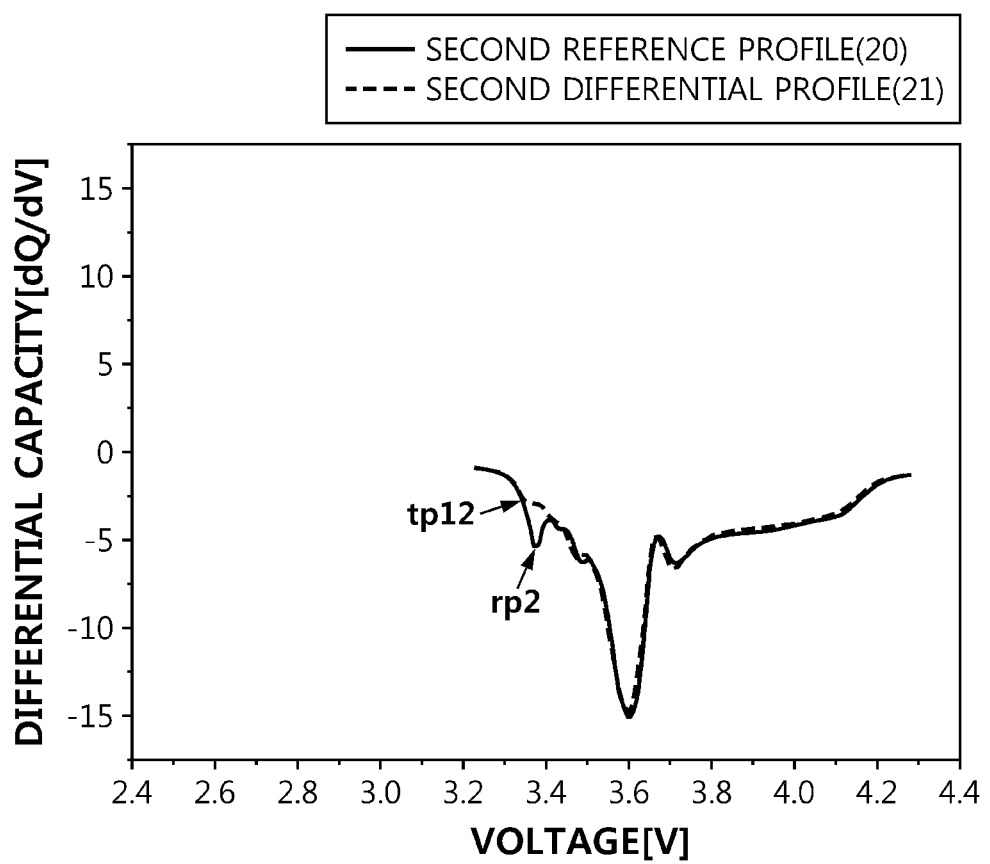
FIG. 6 is a diagram schematically showing a second reference profile and a second differential profile of the first battery, obtained by the apparatus for diagnosing a state of a battery according to an embodiment of the present disclosure.

In the embodiment of FIGS. 4 to 6, the reference profile may be a differential profile for a reference cell. Specifically, the first reference profile 10 is a differential profile obtained during a charging process of the reference cell. In addition, the second reference profile 20 is a differential profile obtained during a discharging process of the reference cell. Preferably, the first reference profile 10 and the second reference profile 20 may be stored in advance.

In addition, preferably, the reference cell is a battery in a BOL (Beginning of Life) state, and may be a battery that is not degraded. For example, the reference cell may be a battery immediately after manufacturing or shipment, or a battery driven in less than predetermined charge/discharge cycles (e.g., 10 cycles).

In the embodiment of FIGS. 4 to 6, the first differential profile 11 and the second differential profile 21 may be differential profiles for the first battery. Specifically, the first differential profile 11 is a differential profile obtained during a charging process of the first battery. In addition, the second differential profile 21 is a differential profile obtained during a discharging process of the first battery.

The control unit 130 may be configured to receive the first differential profile 11 and the second differential profile 21 from the differential profile converting unit 120.

For example, the control unit 130 may be communicatively connected to the differential profile converting unit 120. In addition, the control unit 130 may obtain the first differential profile 11 and the second differential profile 21 from the differential profile converting unit 120.

In the embodiment of FIGS. 5 and 6, the control unit 130 may obtain the first differential profile 11 and the second differential profile 21 from the differential profile converting unit 120.

The control unit 130 may be configured to determine a first target peak tpl 1 among a plurality of peaks included in the first differential profile 11.

Referring to FIG. 5, a plurality of peaks may be included in the first differential profile 11. The peak included in the first differential profile 11 may be a point at which a slope (a change amount of differential capacity with respect to voltage change amount) is 0. Preferably, the peak included in the first differential profile 11 may be a point in which the slope is 0, the slope of a low potential side with respect to the peak is positive, and the slope of a high potential side is negative. For example, in the embodiment of FIG. 5, the peak included in the first differential profile 11 may refer to a point convex upward.

In the embodiment of FIG. 5, the control unit 130 may determine a peak having a voltage value of 3.44 [V] as the first target peak tp11 among a plurality of peaks included in the first differential profile 11.

Figure 1:
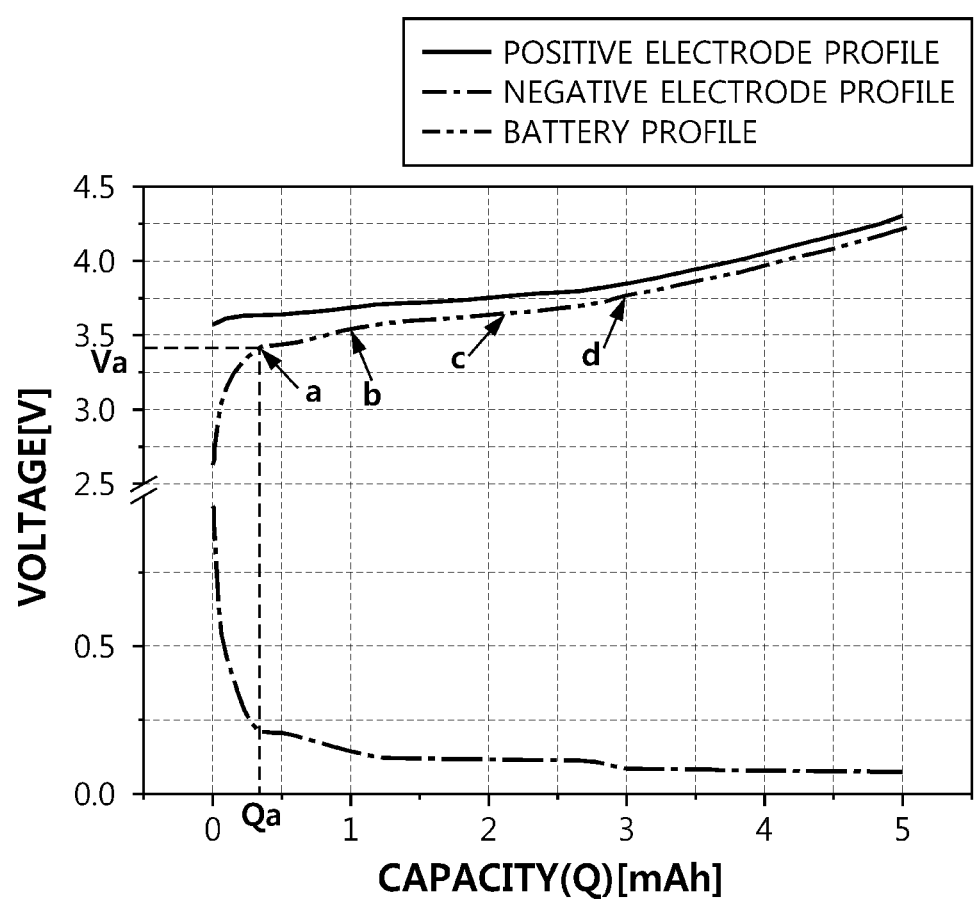
FIG. 1 is a diagram schematically showing an example of a battery profile.
Figure 2:
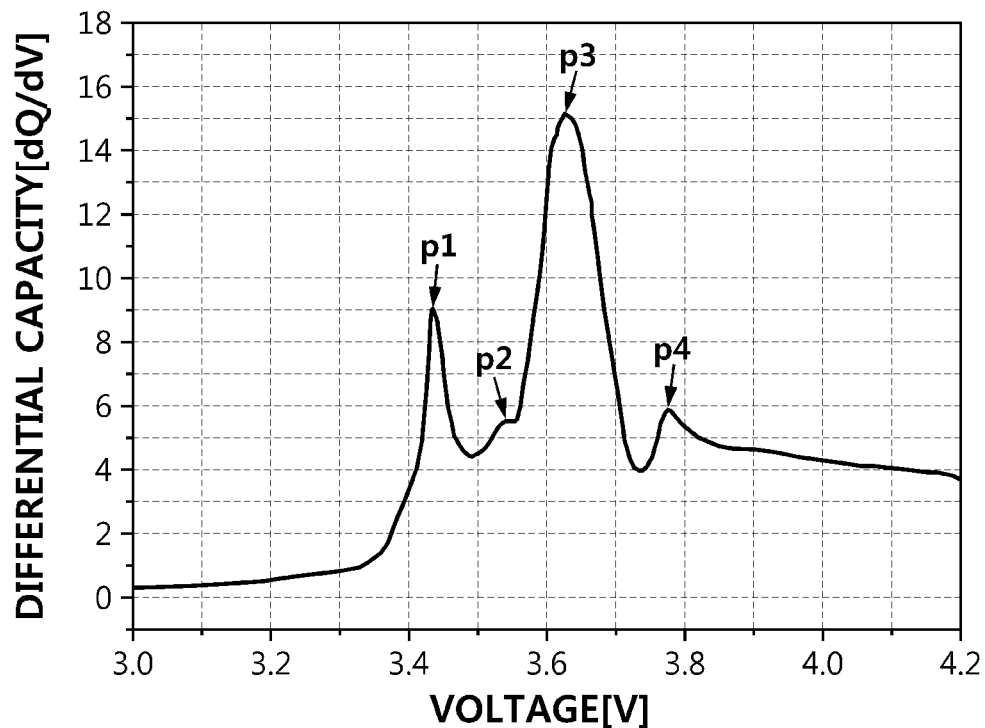
FIG. 2 is a diagram schematically showing an example of a battery differential profile.

Specifically, referring to FIG. 1, when the battery starts being charged, the voltage of the battery may rapidly increase due to the initial resistance, and the voltage of the battery may gradually increase from the point a. In addition, referring to FIGS. 1 and 2, the peak corresponding to the point a may be the first peak p1. The control unit 130 may determine the peak corresponding to the first peak p1 in the first differential profile 11 as the first target peak tp11.

As a specific example, in the differential profile of a battery in which graphite is used as a negative electrode active material, a peak located firstly on a low potential side may be determined as the first target peak tp11. As another example, in the differential profile of a battery in which graphite and silicon are used as a negative electrode active material, a peak located secondarily on the low potential side may be determined as the first target peak tp11. That is, the first target peak tp11 may be determined in consideration of the position in the differential profile, the type of active material of the battery, and the point at which a sudden voltage rise caused by the initial resistance when the battery starts being charged ends.

The control unit 130 may be configured to diagnose a first state of the battery according to a comparison result between the determined first target peak tp11 and a preset first reference peak rp1.

Here, the first reference peak rp1 may be preset as any one of the plurality of peaks included in the first reference profile 10. Specifically, a peak corresponding to the first peak p1 of FIG. 2 among the plurality of peaks included in the first reference profile 10 may be preset as the first reference peak rp1. That is, the first reference peak rp1 of the first reference profile 10 and the first target peak tp11 of the first differential profile 11 may correspond to each other.

For example, in the embodiment of FIG. 5, the voltage value of the first reference peak rp1 may be 3.44 [V], and the voltage value of the first target peak tp11 may be 3.44 [V].

The control unit 130 may compare the voltage value of the first reference peak rp1 with the voltage value of the first target peak tp11, and compare the differential capacity value of the first reference peak rp1 with the differential capacity value of the first target peak. In addition, the control unit 130 may be configured to diagnose the first state of the battery as a pending state or a negative electrode degraded state based on the comparison result.

Here, the pending state may mean a state in which the control unit 130 fails to determine the first state of the battery as a normal state, a positive electrode degraded state or a negative electrode degraded state. That is, the pending state may be a state in which the control unit 130 reserves the determination of the battery state.

It is assumed that the positive electrode of the battery is degraded. In the charging process of the battery, lithium ions extracted from the positive electrode may be inserted into the negative electrode. In addition, extraction of lithium ions from the positive electrode may be generated first from the surface of the positive electrode rather than the core of the positive electrode. When lithium ions are extracted from the surface of the positive electrode, resistance is less affected, so even if the positive electrode of the battery is degraded, the voltage value and differential capacity value of the battery are identical or very close to the voltage value and differential capacity value of the reference cell at the beginning of charge. Therefore, based on the comparison result between the first reference peak rp1 and the first target peak tp11, it is not possible to accurately diagnose whether the positive electrode of the battery is degraded. For this reason, the control unit 130 may diagnose the first state of the battery as a pending state or a negative electrode degraded state based on the comparison result between the first reference peak rp1 and the first target peak tp11.

The control unit 130 may be configured to determine a second target peak tp12 among a plurality of peaks included in the second differential profile 21.

Preferably, the control unit 130 may be configured to diagnose a second state, when the diagnosed first state is the pending state.

For example, if the diagnosed first state is the negative electrode degraded state, the control unit 130 may diagnose the state of the battery as the negative electrode degraded state. Specifically, the control unit 130 may diagnose the state of the battery as a state in which available lithium is lost. Meanwhile, if the diagnosed first state is the pending state, the control unit 130 may complementally diagnose the state of the battery based on the second differential profile 21 related to the discharge of the battery.

Referring to FIG. 6, a plurality of peaks may be included in the second differential profile 21. The peak included in the second differential profile 21 may be a point at which a slope (a change amount of differential capacity with respect to voltage change amount) is 0. Preferably, the peak included in the second differential profile 21 may be a point in which the slope is 0, the slope of a low potential side with respect to the peak is negative, and the slope of a high potential side is positive. For example, in the embodiment of FIG. 6, the peak included in the second differential profile 21 may mean a point convex downward.

It should be noted that the peak of the first differential profile 11 is an upward convex point while the peak of the second differential profile 21 is a downward convex point, which is based on the difference in sign of the differential capacity according to charging and discharging. For example, referring to FIG. 4, in the charging process, a voltage value may increase from a low potential to a high potential, and a capacity value may increase from a low capacity to a high capacity. Accordingly, the differential capacity value may be expressed as a positive number. Conversely, in the discharging process, the voltage value may decrease from a high potential to a low potential, and the capacity value may decrease from a high capacity to a low capacity. Accordingly, the differential capacity value may be expressed as a negative number.

Hereinafter, for convenience of description, it will be described that the differential capacity value of a profile related to charging (e.g., the first reference profile 10 and the first differential profile 11) is a positive value, and the differential capacity value of a profile related to discharging (e.g., the second reference profile 20 and the second differential profile 21) is as a negative value. However, it should be noted that of the differential capacity value of a profile related to discharging is not limitedly interpreted as a positive value substituted with an absolute value.

Specifically, the voltage may sharply decrease at the end of discharge. The control unit 130 may determine a peak corresponding to a point at which the voltage of the battery starts to rapidly decrease at the end of discharge of the second profile as the second target peak tp12, among the plurality of peaks included in the second differential profile 21.

In the embodiment of FIG. 6, the control unit 130 may determine a peak at a position having a voltage value of 3.34 [V] among the plurality of peaks included in the second differential profile 21 as the second target peak tp12.

That is, the first target peak tp11 of the first differential profile 11 and the second target peak tp12 of the second differential profile 21 determined by the control unit 130 may correspond to each other. In the embodiment of FIGS. 5 and 6, it should be noted that the voltage value of the first target peak tp11 and the voltage value of the second target peak tp12 are different from each other because the first target peak tp11 is a peak based on the first profile and the first differential profile 11 obtained in the charging process of the battery and the second target peak tp12 is a peak based on the second profile and the second differential profile 21 obtained in the discharging process of the battery.

The control unit 130 may be configured to diagnose the second state of the battery according to the comparison result between the determined second target peak tp12 and a preset second reference peak rp2.

Here, the second reference peak rp2 may be preset as any one of a plurality of peaks included in the second reference profile 20. Specifically, a peak corresponding to the first reference peak rp1 of FIG. 5 among the plurality of peaks included in the second reference profile 20 may be preset as the second reference peak rp2. That is, the second reference peak rp2 of the second reference profile 20 and the second target peak tp12 of the second differential profile 21 may correspond to each other.

For example, in the embodiment of FIG. 6, the voltage value of the second reference peak rp2 may be 3.38 [V], and the differential capacity value may be −5. In addition, the voltage value of the second target peak tp12 may be 3.34 [V], and the differential capacity value may be −3.1.

Preferably, the control unit 130 may be configured to diagnose the second state as any one of a normal state, a positive electrode degraded state and a negative electrode degraded state.

In general, if the negative electrode of the battery is degraded (specifically, if available lithium is lost), the resistance may be greatly affected to extraction of lithium ions from the negative electrode at the end of discharge of the battery. For example, lithium ions are extracted from the surface of the negative electrode at the beginning of discharge, but lithium ions are extracted from the core of the negative electrode at the end of discharge, so the resistance related to lithium-ion extraction may be affected more greatly at the end of discharge rather than at the beginning of discharge. Since the resistance related to lithium-ion extraction at the end of discharge may act more greatly as the negative electrode is degraded more, the voltage value and the differential capacity value of the second target peak tp12 may be changed at the end of discharge. Therefore, the control unit 130 may diagnose whether the negative electrode of the battery is degraded based on the comparison result between the second reference peak rp2 and the second target peak tp12.

In addition, if the positive electrode of the battery is degraded, the positive electrode capacity may be lost because the area capable of reacting in the positive electrode is reduced. Due to the loss of the positive electrode capacity, the voltage value and the differential capacity value of the second target peak tp12 may be changed due to the effect of overvoltage at the end of discharge. Therefore, the control unit 130 may diagnose not only whether the negative electrode of the battery is degraded but also the positive electrode is degraded based on the comparison result between the second reference peak rp2 and the second target peak tp12.

The control unit 130 may be configured to diagnose a state of the battery by using at least one of the diagnosed first state and the diagnosed second state.

Figure 7:
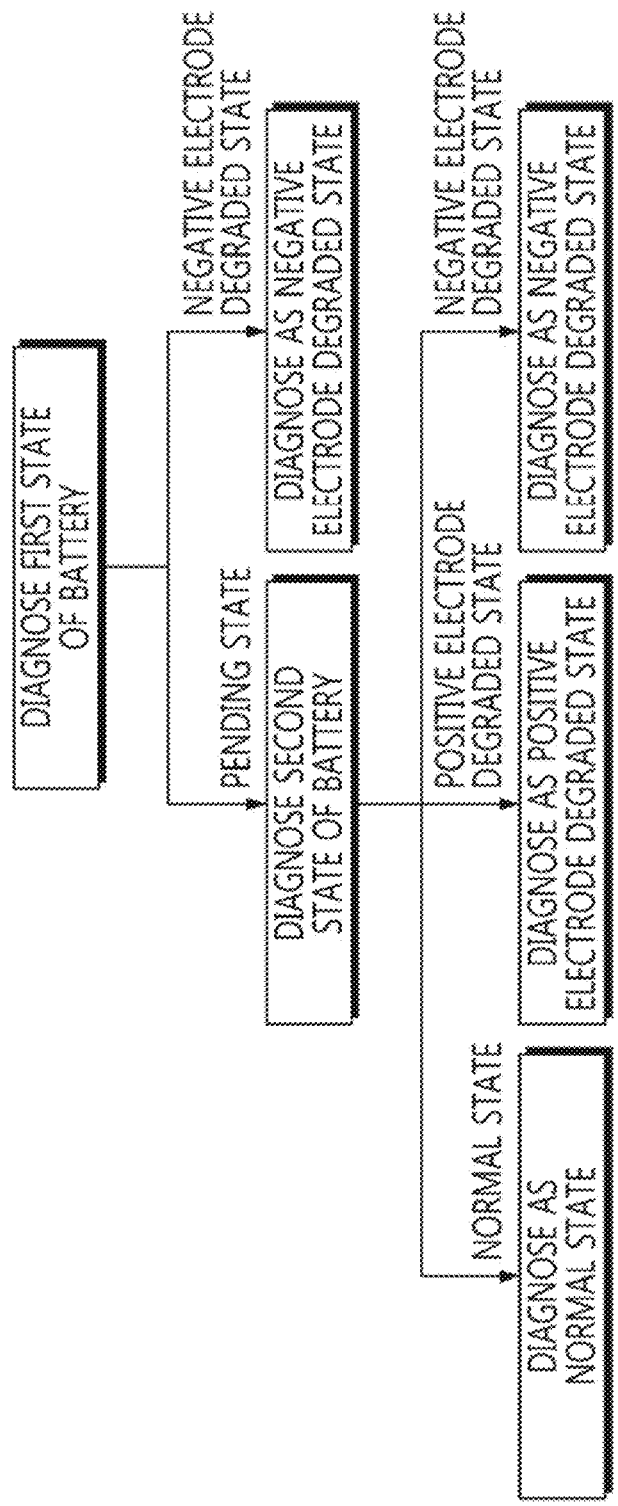
FIG. 7 is a diagram schematically showing a process of diagnosing a state of a battery by the apparatus for diagnosing a state of a battery according to an embodiment of the present disclosure.

FIG. 7 is a diagram schematically showing a process of diagnosing a state of a battery by the apparatus 100 for diagnosing a state of a battery according to an embodiment of the present disclosure.

Referring to FIG. 7, the control unit 130 may diagnose the first state of the battery based on the comparison result between the first reference peak rp1 and the first target peak tp11. If the diagnosed first state is the negative electrode degraded state, the control unit 130 may diagnose the state of the battery as the negative electrode degraded state.

Meanwhile, if the diagnosed first state is a pending state, the control unit 130 may diagnose the second state of the battery based on the comparison result between the second reference peak rp2 and the second target peak tp12. The diagnosed second state may be a normal state, a positive electrode degraded state, or a negative electrode degraded state.

For example, in the embodiment of FIG. 5, it is assumed that the voltage values and the differential capacity values of the first reference peak rp1 and the first target peak tp11 are the same. Since the voltage values and the differential capacity values of the first reference peak rp1 and the first target peak tp11 are the same, the control unit 130 may diagnose the first state of the first battery as a pending state. After that, since the diagnosed first state of the first battery is a pending state, the control unit 130 may compare the voltage values and the differential capacity values of the second reference peak rp2 and the second target peak tp12.

In the embodiment of FIG. 6, it is assumed that the voltage value of the second reference peak rp2 is greater than the voltage value of the second target peak tp12. In addition, it is assumed that the differential capacity value of the second reference peak rp2 is smaller than the differential capacity value of the second target peak tp12. The control unit 130 may diagnose the second state of the first battery as a positive electrode degraded state according to the comparison result of the voltage values and the differential capacity values of the second reference peak rp2 and the second target peak tp12. Accordingly, the control unit 130 may diagnose the state of the first battery as a positive electrode degraded state.

The apparatus 100 for diagnosing a state of a battery according to an embodiment of the present disclosure may accurately diagnose the state of the battery by considering both the first differential profile 11 obtained in the charging process of the battery and the second differential profile 21 obtained in the discharging process of the battery. That is, since the apparatus 100 for diagnosing a state of a battery may diagnose the state of the battery in consideration of both the charging and discharging situations of the battery, the state of the battery may be diagnosed more accurately, compared to the case of diagnosing the state of the battery by considering only the charging situation or the discharging situation.

In addition, the apparatus 100 for diagnosing a state of a battery may adjust at least one of an upper limit and a lower limit of the charging state of the battery, a temperature, a charging C-rate, and a discharging C-rate, based on the diagnosed state of the battery, so that the battery is not degraded any more. For example, the control unit 130 may lower the charging C-rate and/or the discharging C-rate for the battery. In addition, the control unit 130 may lower the upper limit of the charging state of the battery and raise the lower limit of the charging state. Also, the control unit 130 may maintain the temperature of the battery at a predetermined higher level.

Meanwhile, the control unit 130 included in the apparatus 100 for diagnosing a state of a battery according to an embodiment of the present disclosure may optionally include a processor, an application-specific integrated circuit (ASIC), another chipset, a logic circuit, a register, a communication modem, and a data processing device, and the like, known in the art to execute various control logics disclosed below. In addition, when the control logic is implemented in software, the control unit 130 may be implemented as a set of program modules. At this time, the program module may be stored in a memory and executed by the control unit 130. The memory may be provided in or out of the control unit 130, and may be connected to the control unit 130 by various well-known means.

Hereinafter, the content in which the control unit 130 diagnoses the first state and the second state of the battery by using the first reference peak rp1 and the first target peak tp11 will be described in detail.

The control unit 130 may be configured to set a predetermined reference voltage based on the voltage value of the first reference peak rp1.

For example, in the embodiment of FIG. 5, even if the actual state of the first battery is a normal state or a positive electrode degraded state, the voltage value of the first reference peak rp1 and the voltage value of the first target peak tp11 may not be the same. That is, due to an error that may occur in the process of measuring the voltage of the first battery, the voltage value of the first reference peak rp1 and the voltage value of the first target peak tp11 may not be the same. Accordingly, the control unit 130 may set the predetermined reference voltage based on the voltage value of the first reference peak rp1 in consideration of an error that may occur in the process of measuring the voltage of the first battery.

For example, if the voltage value of the first reference peak rp1 is 3.44 [V], the control unit 130 may set the reference voltage to 3.45 [V].

In addition, the control unit 130 may compare the voltage value of the first target peak tp11 with the reference voltage.

For example, if the voltage value of the first target peak tp11 is greater than the reference voltage, the control unit 130 may be configured to diagnose the first state as the negative electrode degraded state.

As another example, if the voltage value of the first target peak tp11 is equal to or smaller than the reference voltage, the control unit 130 may be configured to diagnose the first state as the pending state.

In the embodiment of FIG. 5, the voltage value of the first reference peak rp1 may be 3.44 [V], the reference voltage may be 3.45 [V], and the voltage value of the first target peak tp11 may be 3.44 [V]. Since the voltage value (3.44 [V]) of the first target peak tp11 is smaller than the reference voltage (3.45 [V]), the control unit 130 may diagnose the first state of the first battery as a pending state. After that, the control unit 130 may diagnose the second state of the first battery by comparing the second reference peak rp2 and the second target peak tp12.

First, the control unit 130 may be configured to set a predetermined reference region based on the voltage value of the second reference peak rp2. Here, the reference region may be set in consideration of an error that may occur in the process of measuring the voltage of the battery.

For example, in the embodiment of FIG. 6, if the voltage value of the second reference peak rp2 is 3.38 [V], the control unit 130 may set the reference region to 3.37 [V] or more and 3.39 [V] or less.

In addition, the control unit 130 may compare the voltage value of the second target peak tp12 with the reference region.

For example, if the voltage value of the second target peak tp12 is greater than an upper limit of the reference region, the control unit 130 may be configured to diagnose the second state as the negative electrode degraded state.

As another example, if the voltage value of the second target peak tp12 is smaller than a lower limit of the reference region, the control unit 130 may be configured to diagnose the second state as the positive electrode degraded state.

As another example, if the voltage value of the second target peak tp12 falls within the reference region, the control unit 130 may be configured to diagnose the second state as the normal state.

In the embodiment of FIG. 6, the voltage value of the second reference peak rp2 may be 3.38 [V], the reference region may be 3.37 [V] or more and 3.39 [V] or less, and the voltage value of the second target peak tp12 may be 3.34 [V]. Since the voltage value (3.34 [V]) of the second target peak tp12 is smaller than the lower limit (3.37 [V]) of the reference region, the control unit 130 may diagnose the second state of the first battery as a positive electrode degraded state.

That is, referring to FIGS. 5 and 6, the first state of the first battery is diagnosed as a pending state based on the first differential profile 11, but the second state of the first battery may be diagnosed as a positive electrode degraded state based on the second differential profile 21.

Therefore, since the apparatus 100 for diagnosing a state of a battery according to an embodiment of the present disclosure diagnoses the state of the battery in consideration of both the first differential profile 11 and the second differential profile 21, there is an advantage of more accurately diagnosing the state of the battery.

The control unit 130 may further consider the differential capacity value as well as the voltage value of the second target peak tp12 when diagnosing the second state of the battery.

First, the control unit 130 may be configured to set a predetermined differential capacity region based on the differential capacity value of the second reference peak rp2. Here, the differential capacity region may be set in consideration of an error that may occur in the process of measuring the capacity of the battery and converting the measured capacity into the differential capacity.

For example, in the embodiment of FIG. 6, if the differential capacity value of the second reference peak rp2 is −5, the control unit 130 may set the differential capacity region to −5.5 or more and −4.5 or less.

In addition, the control unit 130 may compare the voltage value of the second target peak tp12 with the reference region and compare the differential capacity value with the differential capacity region.

For example, if the voltage value of the second target peak tp12 is greater than the upper limit of the reference region and the differential capacity value of the second target peak tp12 is smaller than the lower limit of the differential capacity region, the control unit 130 may be configured to diagnose the second state as the negative electrode degraded state.

As another example, if the voltage value of the second target peak tp12 is smaller than the lower limit of the reference region and the differential capacity value of the second target peak tp12 is greater than the upper limit of the differential capacity region, the control unit 130 may be configured to diagnose the second state as the positive electrode degraded state.

As still another example, if the voltage value of the second target peak tp12 falls within the reference region and the differential capacity value of the second target peak tp12 falls within the differential capacity region, the control unit 130 may be configured to diagnose the second state as the normal state.

In the embodiment of FIG. 6, the voltage value of the second reference peak rp2 may be 3.38 [V], the reference region may be 3.37 [V] or more and 3.39 [V] or less, and the voltage value of the second target peak tp12 may be 3.34 [V]. In addition, the differential capacity value of the second reference peak rp2 may be −5, the differential capacity region may be −5.5 or more and −4.5 or less, and the differential capacity value of the second target peak tp12 may be −3.1. Since the voltage value (3.34 [V]) of the second target peak tp12 is smaller than the lower limit (3.37 [V]) of the reference region and the differential capacity value (−3.1) of the second target peak tp12 is greater than the upper limit (−4.5) of the differential capacity region, the control unit 130 may diagnose the second state of the first battery as a positive electrode degraded state.

The apparatus 100 for diagnosing a state of a battery according to an embodiment of the present disclosure may not only diagnose the state of the battery by considering both the first differential profile 11 and the second differential profile 21, but also diagnose the state of the battery by considering both the voltage value and the differential capacity value of the battery in the second differential profile 21. Accordingly, the state of the battery may be diagnosed more accurately.

Hereinafter, an embodiment in which the control unit 130 diagnoses the state of the second battery will be described with reference to FIGS. 8 and 9.

Figure 8:
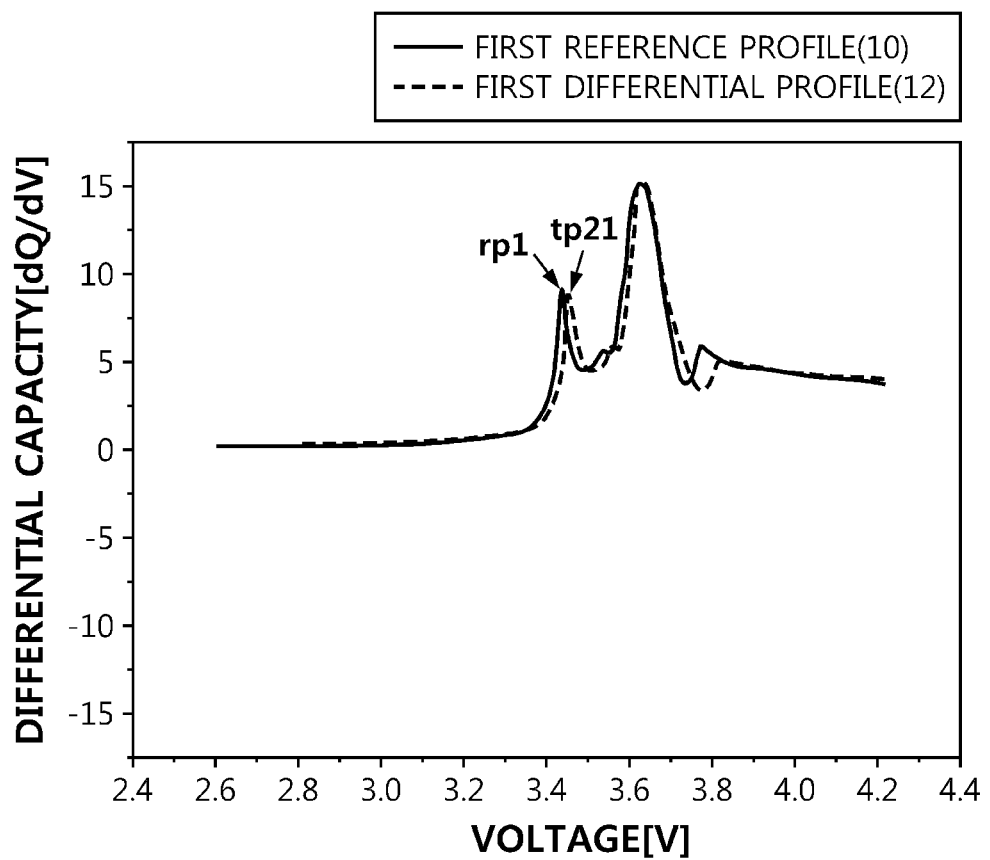
FIG. 8 is a diagram schematically showing the first reference profile and a first differential profile of a second battery, obtained by the apparatus for diagnosing a state of a battery according to an embodiment of the present disclosure.

FIG. 8 is a diagram schematically showing the first reference profile 10 and a first differential profile 12 of a second battery, obtained by the apparatus 100 for diagnosing a state of a battery according to an embodiment of the present disclosure. FIG. 9 is a diagram schematically showing the second reference profile 20 and a second differential profile 22 of the second battery, obtained by the apparatus 100 for diagnosing a state of a battery according to an embodiment of the present disclosure.

In the embodiment of FIG. 8, the voltage value of the first reference peak rp1 may be 3.44 [V], the reference voltage may be set to 3.45 [V], and the voltage value of the first target peak tp21 of the second battery may be 3.46 [V]. Since the voltage value (3.46 [V]) of the first target peak tp21 of the second battery is greater than the reference voltage (3.45 [V]), the control unit 130 may diagnose the first state of the second battery as a negative electrode degraded state. In addition, the second state of the second battery may not be diagnosed.

Unlike the above, in the embodiment of FIG. 8, it is assumed that the voltage value of the first target peak tp21 of the second battery is 3.45 [V]. In this case, since the voltage value (3.45 [V]) of the first target peak tp21 of the second battery is the same as the reference voltage (3.45 [V]), the control unit 130 may diagnose the first state of the second battery as a pending state. That is, if the voltage value of the first target peak tp21 of the second battery falls within an error range of the voltage value of the first reference peak rp1, the control unit 130 may diagnose the second state of the second battery.

Figure 9:
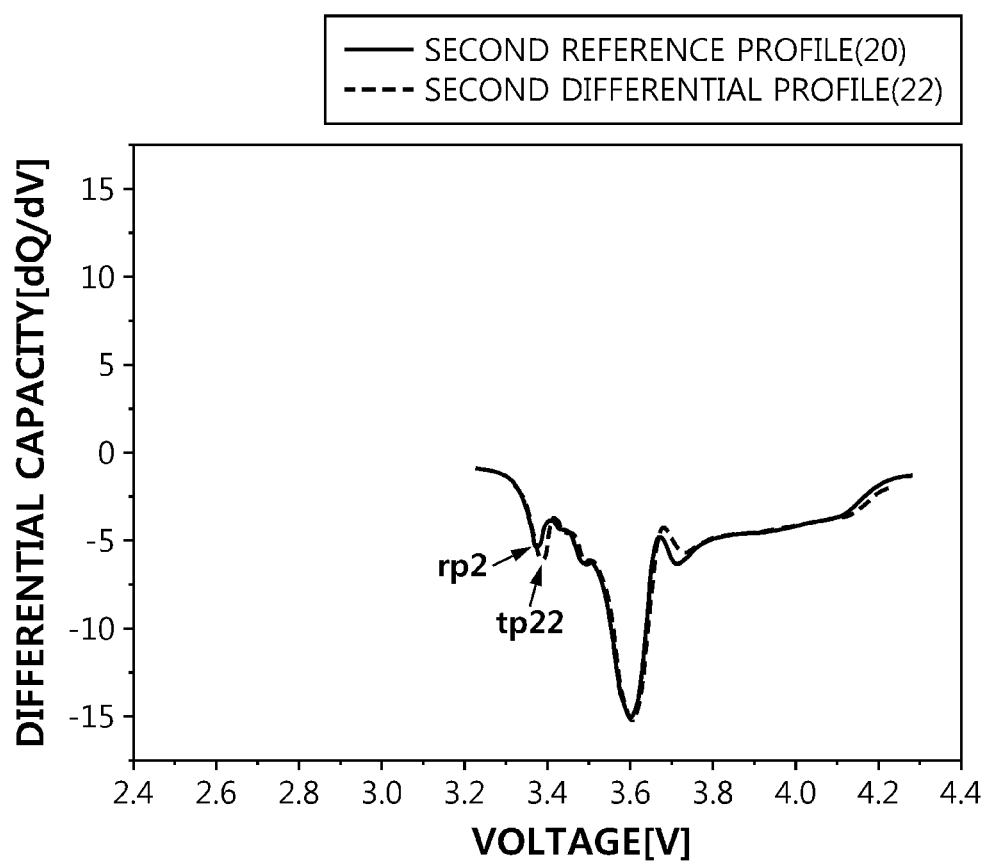
FIG. 9 is a diagram schematically showing the second reference profile and a second differential profile of the second battery, obtained by the apparatus for diagnosing a state of a battery according to an embodiment of the present disclosure.

In the embodiment of FIG. 9, the voltage value of the second reference peak rp2 may be 3.38 [V], the reference region may be 3.37 [V] or more and 3.39 [V] or less, and the voltage value of the second target peak tp22 may be 3.4 [V]. In addition, the differential capacity value of the second reference peak rp2 may be −5, the differential capacity region may be −5.5 or more and −4.5 or less, and the differential capacity value of the second target peak tp22 may be −6.4. Since the voltage value (3.4 [V]) of the second target peak tp22 is greater than the upper limit (3.39 [V]) of the reference region and the differential capacity value (−6.4) of the second target peak tp22 is smaller than the lower limit (−5.5), the control unit 130 may diagnose the second state of the second battery as a negative electrode degraded state.

Since the apparatus 100 for diagnosing a state of a battery according to an embodiment of the present disclosure further diagnoses the state of the battery complementarily by using the second differential profile 22 after diagnosing the state of the battery using the first differential profile 12, the state of the battery may be diagnosed more accurately.

Hereinafter, an embodiment in which the control unit 130 diagnoses the degradation accelerated state of the battery will be described. However, for convenience of description, descriptions of contents overlapping with those described above will be omitted.

First, referring to FIG. 3, the apparatus 100 for diagnosing a state of a battery according to an embodiment of the present disclosure may further include a storage unit 140.

The storage unit 140 may be configured to store a plurality of first differential profiles and a plurality of second differential profiles converted by the differential profile converting unit 120 at a plurality of cycles.

Specifically, the storage unit 140 may be communicatively connected to the differential profile converting unit 120. The differential profile converting unit 120 may obtain a first differential profile and a second differential profile at each charge/discharge cycle of the battery and store the same in the storage unit 140. That is, the storage unit 140 may store the first differential profile and the second differential profile at each charge/discharge cycle of the battery.

Here, the storage unit 140 may store programs, data and the like required for the control unit 130 to diagnose a state of a battery. That is, the storage unit 140 may store data necessary for operation and function of each component of the apparatus 100 for diagnosing a state of a battery, data generated in the process of performing the operation or function, or the like. The storage unit 140 is not particularly limited in its kind as long as it is a known information storage means that can record, erase, update and read data. As an example, the information storage means may include random access memory (RAM), flash memory, read-only memory (ROM), electrically erasable programmable read-only memory (EEPROM), registers, and the like. In addition, the storage unit 140 may store program codes in which processes executable by the control unit 130 are defined.

The control unit 130 may be communicatively connected to the storage unit 140. Specifically, the control unit 130 may access the storage unit 140 to obtain the plurality of first differential profiles and the plurality of second differential profiles stored in the storage unit 140.

The control unit 130 may be configured to determine the first target peak in each of the plurality of first differential profiles stored in the storage unit 140.

For example, for the same battery, a third battery may mean a battery when the number of charge/discharge cycles is 100, and a fourth battery may mean a battery when the number of charge/discharge cycles of the first battery is 200.

The control unit 130 may access the storage unit 140 to obtain a first differential profile 13 of the third battery. Also, the control unit 130 may obtain a first differential profile 14 of the fourth battery. In addition, the control unit 130 may determine a first target peak in the first differential profile 13 of the third battery and determine a first target peak in the first differential profile 14 of the fourth battery.

The control unit 130 may be configured to further diagnose a third state of the battery based on the change of voltage of the determined plurality of first target peaks at each cycle.

For example, the control unit 130 may be configured to diagnose the third state as a pending state or a negative electrode degradation accelerated state. Specifically, the control unit 130 may be configured to diagnose the third state as the negative electrode degradation accelerated state, if the voltage of the plurality of first target peaks at each cycle increases.

As the negative electrode of the battery is degraded, the voltage value of the first target peak may be changed to a high potential side. Accordingly, the control unit 130 may diagnose the third state of the battery as a negative electrode degradation accelerated state, if the voltage of the plurality of first target peaks increases as the number of charge/discharge cycles increases.

After that, the control unit 130 may be configured to determine the second target peak in each of the plurality of second differential profiles stored in the storage unit 140.

The control unit 130 may access the storage unit 140 to obtain a second differential profile 23 of the third battery. Also, the control unit 130 may obtain a second differential profile 24 of the fourth battery. In addition, the control unit 130 may determine a second target peak in the second differential profile 23 of the third battery and determine a second target peak in the second differential profile 24 of the fourth battery.

The control unit 130 may be configured to further diagnose a fourth state of the battery based on the change of voltage and the change of differential capacity of the plurality of determined second target peaks at each cycle.

Specifically, the control unit 130 may be configured to diagnose the fourth state as any one of a normal state, a positive electrode degradation accelerated state, and the negative electrode degradation accelerated state.

For example, when the voltage value of the plurality of second target peaks at each cycle increases and the differential capacity value of the plurality of second target peaks at each cycle decreases, the control unit 130 may be configured to diagnose the fourth state as a negative electrode degradation accelerated state.

As another example, when the voltage value of the plurality of second target peaks at each cycle decreases and the differential capacity value of the plurality of second target peaks at each cycle increases, the control unit 130 may be configured to diagnose the fourth state a positive electrode degradation accelerated state.

As still another example, when the voltage value of the plurality of second target peaks at each cycle is the same and the differential capacity value of the plurality of second target peaks at each cycle is the same, the control unit 130 may be configured to diagnose the fourth state as a degradation non-accelerated state.

The control unit 130 may be configured to further diagnose the degradation accelerated state of the battery by using at least one of the diagnosed third state and the diagnosed fourth state.

Preferably, the control unit 130 may be configured to diagnose the fourth state of the battery, if the diagnosed third state is the pending state.

That is, if the diagnosed third state of the battery is a negative electrode degradation accelerated state, the control unit 130 may diagnose the state of the battery as a negative electrode degradation accelerated state. Conversely, if the diagnosed third state of the battery is a pending state, the control unit 130 may diagnose the fourth state of the battery and diagnose the state of the battery based on the diagnosed fourth state.

The apparatus 100 for diagnosing a state of a battery according to an embodiment of the present disclosure may diagnose not only whether the battery is degraded but also whether the degradation of the battery is accelerated. Therefore, the apparatus 100 for diagnosing a state of a battery may adjust at least one of an upper charging state, a lower charging state, a temperature, a charging C-rate and a discharging C-rate of the battery based on whether the diagnosed degradation is accelerated, so that the degradation of the battery is not accelerated.

Hereinafter, a specific embodiment in which the control unit 130 diagnoses whether the degradation of the first battery is accelerated will be described with reference to FIG. 10.

Figure 10:
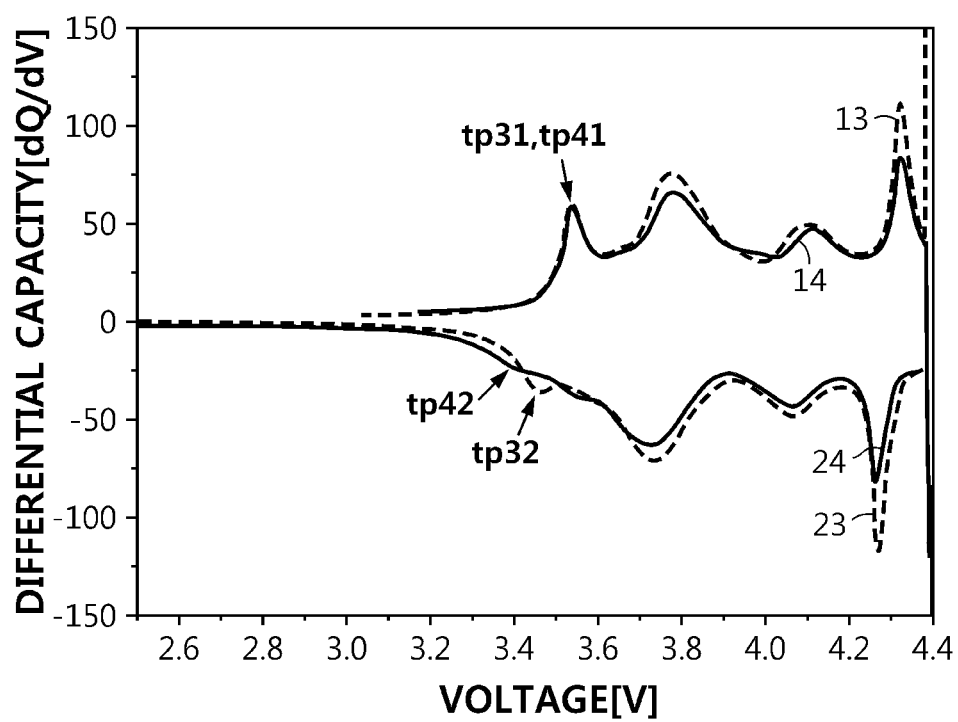
FIG. 10 is a diagram schematically showing differential profiles of a third battery and a fourth battery, obtained by the apparatus for diagnosing a state of a battery according to an embodiment of the present disclosure.

FIG. 10 is a diagram schematically showing differential profiles of a third battery and a fourth battery, obtained by the apparatus 100 for diagnosing a state of a battery according to an embodiment of the present disclosure.

In the embodiment of FIG. 10, for the first battery, the third battery may mean the first battery when the number of charge/discharge cycles is 100 times, and the fourth battery may mean the first battery when the number of charge/discharge cycles is 200 times.

The control unit 130 may determine a first target peak tp31 of the third battery in the first differential profile 13. In addition, the control unit 130 may determine a first target peak tp41 of the fourth battery in the first differential profile 14. The voltage value of the first target peak tp31 of the third battery and the voltage value of the first target peak tp41 of the fourth battery may be 3.44 [V].

Since the voltage value of the first target peak tp31 of the third battery and the voltage value of the first target peak tp41 of the fourth battery are identically 3.44 [V], the control unit 130 may diagnose the third state of the first battery as a pending state. That is, when the number of charge/discharge cycles of the first battery is 200, the control unit 130 may diagnose the third state of the first battery as a pending state.

In addition, since the diagnosed third state is a pending state, the control unit 130 may diagnose the fourth state of the first battery by comparing the voltage values and the differential capacity values of a second target peak tp32 of the third battery and a second target peak tp42 of the fourth battery.

First, the control unit 130 may determine the second target peak tp32 of the third battery in the second differential profile 23. In addition, the control unit 130 may determine the second target peak tp42 of the fourth battery in the second differential profile 24.

For example, in the embodiment of FIG. 10, the voltage value of the second target peak tp32 of the third battery may be 3.35 [V], and the differential capacity value may be −37.

In addition, the voltage value of the second target peak tp42 of the fourth battery may be 3.31 [V], and the differential capacity value may be −25.

Since the voltage value (3.35 [V]) of the second target peak tp32 of the third battery is greater than the voltage value (3.31 [V]) of the second target peak tp42 of the fourth battery and the differential capacity value (−37) of the second target peak tp32 of the third battery is smaller than the differential capacity value (−25) of the second target peak tp42 of the fourth battery, the control unit 130 may diagnose the fourth state of the first battery as a positive electrode degradation accelerated state. That is, when the number of charge/discharge cycles of the first battery is 200, the control unit 130 may diagnose the fourth state of the first battery as a positive electrode degradation accelerated state.

As a result, the control unit 130 may diagnose the state of the first battery as a positive electrode degradation accelerated state.

As such, the apparatus 100 for diagnosing a state of a battery according to an embodiment of the present disclosure has an advantage of not only diagnosing whether the battery is degraded but also tracking and diagnosing whether the degradation of the battery is accelerated according to the charge/discharge cycle.

The apparatus 100 for diagnosing a state of a battery according to the present disclosure may be applied to a BMS (Battery Management System). That is, the BMS according to the present disclosure may include the apparatus 100 for diagnosing a state of a battery. In this configuration, at least some of the components of the apparatus 100 for diagnosing a state of a battery may be implemented by supplementing or adding functions of components included in a conventional BMS. For example, the profile obtaining unit 110, the differential profile converting unit 120, the control unit 130 and the storage unit 140 of the apparatus 100 for diagnosing a state of a battery may be implemented as components of the BMS.

Figure 11:
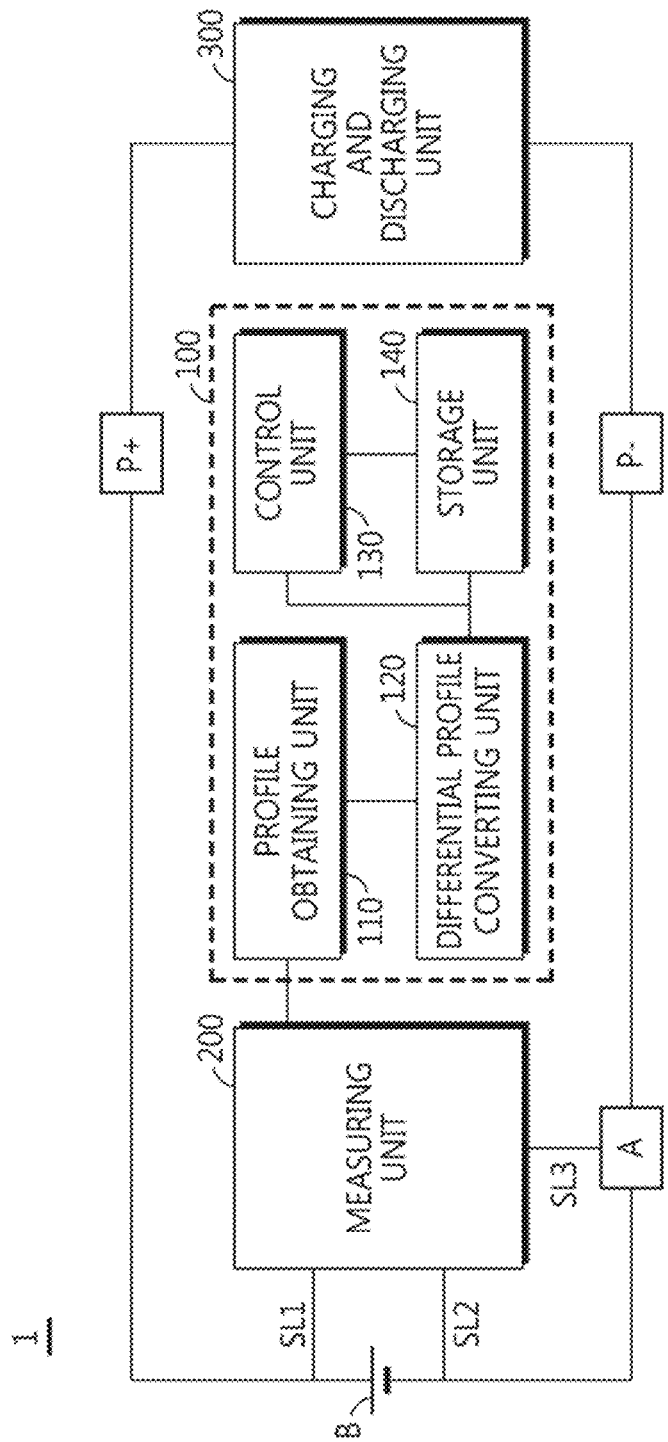
FIG. 11 is a diagram showing an exemplary configuration of a battery pack including the apparatus for diagnosing a state of a battery according to an embodiment of the present disclosure.

FIG. 11 is a diagram showing an exemplary configuration of a battery pack 1 including the apparatus 100 for diagnosing a state of a battery according to an embodiment of the present disclosure.

Referring to FIG. 11, the apparatus 100 for diagnosing a state of a battery may be provided to a battery pack 1. That is, the battery pack 1 according to the present disclosure may include the apparatus 100 for diagnosing a state of a battery as described above and at least one battery B. In addition, the battery pack 1 may further include a measuring unit 200 configured to measure voltage and/or current of the battery B, a charging and discharging unit 300 configured to charge and/or discharge the battery B, electrical equipment (relays, fuses, etc.), a case, and the like. In addition, the battery pack 1 may further include a heating unit (not shown) capable of emitting heat to increase the temperature of the battery B.

Specifically, the measuring unit 200 may be configured to measure the voltage of the battery B through a first sensing line SL1 and a second sensing line SL2. Also, the measuring unit 200 may measure the current of the battery B through a third sensing line SL3 connected to a current measuring unit A. The profile obtaining unit 110 may obtain the first profile and the second profile by obtaining the voltage information and the current information of the battery B from the measuring unit 200.

Figure 12:
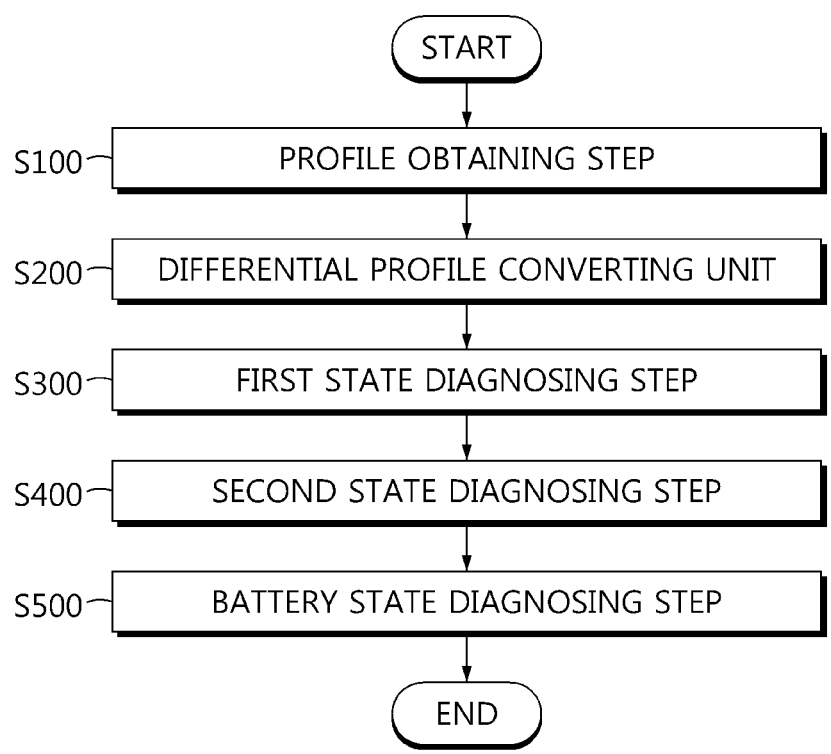
FIG. 12 is a diagram schematically showing a method for diagnosing a state of a battery according to another embodiment of the present disclosure.

FIG. 12 is a diagram schematically showing a method for diagnosing a state of a battery according to another embodiment of the present disclosure. Each step of the method for diagnosing a state of a battery may be performed by the apparatus 100 for diagnosing a state of a battery.

Referring to FIG. 12, the method for diagnosing a state of a battery may include a profile obtaining step (S100), a differential profile converting step (S200), a first state diagnosing step (S300), a second state diagnosing step (S400), and a battery state diagnosing step (S500).

The profile obtaining step (S100) is a step of obtaining a first profile for voltage and capacity of a battery while the battery is being charged and obtaining a second profile for voltage and capacity of the battery while the battery is being discharged, and may be performed by the profile obtaining unit 110.

For example, the first profile and the second profile may be profiles for voltage and capacity of a battery.

The differential profile converting step (S200) is a step of converting the first profile and the second profile into a first differential profile 11 and a second differential profile 21 for voltage and differential capacity of the battery, respectively, and may be performed by the differential profile converting unit 120.

For example, the first differential profile 11 and the second differential profile 21 may be profiles for voltage and differential capacity of a battery.

The first state diagnosing step (S300) is a step of determining a first target peak tp11 among a plurality of peaks included in the first differential profile 11 and diagnosing a first state of the battery according to the comparison result between the determined first target peak tp11 and a preset first reference peak rp1, and may be performed by the control unit 130.

Preferably, the control unit 130 may diagnose the first state of the battery as a pending state or a negative electrode degraded state.

For example, the control unit 130 may set the predetermined reference voltage based on the voltage value of the first reference peak rp1. If the voltage value of the first target peak tp11 is greater than the reference voltage, the control unit 130 may diagnose the first state as a negative electrode degraded state. Conversely, if the voltage value of the first target peak tp11 is equal to or smaller than the reference voltage, the control unit 130 may diagnose the first state as the pending state.

The second state diagnosing step (S400) is a step of determining a second target peak tp12 among a plurality of peaks included in the second differential profile 21 and diagnosing the second state of the battery according to the comparison result between the determined second target peak tp12 and a preset second reference peak rp2, and may be performed by the control unit 130.

Preferably, the control unit 130 may diagnose the second state, when the diagnosed first state is the pending state.

For example, the control unit 130 may set a predetermined reference region based on the voltage value of the second reference peak rp2. If the voltage value of the second target peak tp12 is greater than the upper limit of the reference region, the control unit 130 may diagnose the second state as the negative electrode degraded state. Alternatively, if the voltage value of the second target peak tp12 is smaller than the lower limit of the reference region, the control unit 130 may diagnose the second state as a positive electrode degraded state. In contrast, if the voltage value of the second target peak tp12 falls within the reference region, the control unit 130 may diagnose the second state as a normal state.

The battery state diagnosing step S500 is a step of diagnosing the state of the battery by using at least one of the diagnosed first state and the diagnosed second state, and may be performed by the control unit 130.

If the diagnosed first state is a negative electrode degraded state, the control unit 130 may diagnose the battery state as a negative electrode degraded state. Alternatively, if the diagnosed first state is a pending state, the control unit 130 may diagnose the battery state as a normal state, a positive electrode degraded state, or a negative electrode degraded state according to the diagnosed second state.

The embodiments of the present disclosure described above are not necessarily implemented by an apparatus and method but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
100: apparatus for diagnosing a state of a battery
110: profile obtaining unit
120: differential profile converting unit
130: control unit
140: storage unit
200: measuring unit
300: charging and discharging unit
B: battery

What is claimed is:

1. An apparatus for diagnosing a state of a battery, comprising:
a control unit configured to:
receive a first differential profile converted from a first profile for voltage and capacity of a battery while the battery is being charged;
receive a second differential profile converted from a second profile for voltage and capacity of the battery while the battery is being discharged;
determine a first target peak from among a first plurality of peaks included in the first differential profile;
diagnose a first indication of the state of the battery according to a first comparison result between the determined first target peak and a preset first reference peak;
determine a second target peak from among a second plurality of peaks included in the second differential profile;
diagnose a second indication of the state of the battery according to a second comparison result between the determined second target peak and a preset second reference peak; and diagnose the state of the battery based on at least one of the diagnosed first indication or the diagnosed second indication, wherein the control unit is configured to:

diagnose the first indication of the state of the battery as a pending state or a negative electrode degraded state, and diagnose the second indication of the state of the battery as any one of the normal state, a positive electrode degraded state or the negative electrode degraded state.

2. The apparatus for diagnosing a state of a battery according to claim 1, wherein the control unit is configured to diagnose the second state, in response to the diagnosed first indication of the state of the battery being the pending state.

3. The apparatus for diagnosing a state of a battery according to claim 2, wherein the control unit is configured to:

set a predetermined reference voltage based on a voltage value of the first reference peak, diagnose the first indication of the state of the battery as the negative electrode degraded state, in response to the voltage value of the first target peak being greater than the reference voltage, and diagnose the first indication of the state of the battery as the pending state, in response to the voltage value of the first target peak being equal to or smaller than the reference voltage.

4. The apparatus for diagnosing a state of a battery according to claim 2, wherein the control unit is configured to:

set a predetermined reference region based on a voltage value of the second reference peak, diagnose the second indication of the state of the battery as the negative electrode degraded state, in response to a voltage value of the second target peak being greater than an upper limit of the reference region, diagnose the second indication of the state of the battery as the positive electrode degraded state, in response to the voltage value of the second target peak being smaller than a lower limit of the reference region, and diagnose the second indication of the state of the battery as the normal state, in response to the voltage value of the second target peak falling within the reference region.

5. The apparatus for diagnosing a state of a battery according to claim 4, wherein the control unit is configured to:

set a predetermined differential capacity region based on a differential capacity value of the second reference peak, diagnose the second indication of the state of the battery as the negative electrode degraded state, in response to the voltage value of the second target peak being greater than the upper limit of the reference region and the differential capacity value of the second target peak being smaller than a lower limit of the differential capacity region, diagnose the second indication of the state of the battery as the positive electrode degraded state, in response to the voltage value of the second target peak being smaller than the lower limit of the reference region and the differential capacity value of the second target peak being greater than an upper limit of the differential capacity region, and diagnose the second indication of the state of the battery as the normal state, in response to the voltage value of the second target peak falling within the reference region and the differential capacity value of the second target peak falling within the differential capacity region.

6. A battery pack, comprising the apparatus for diagnosing a state of a battery according to claim 1.

7. An apparatus for diagnosing a state of a battery comprising:

a control unit configured to:

receive a first differential profile converted from a first profile for voltage and capacity of a battery while the battery is being charged;

receive a second differential profile converted from a second profile for voltage and capacity of the battery while the battery is being discharged;

determine a first target peak from among a first plurality of peaks included in the first differential profile;

diagnose a first indication of the state of the battery according to a first comparison result between the determined first target peak and a preset first reference peak;

determine a second target peak from among a second plurality of peaks included in the second differential profile;

diagnose a second indication of the state of the battery according to a second comparison result between the determined second target peak and a preset second reference peak; and diagnose the state of the battery based on at least one of the diagnosed first indication or the diagnosed second indication, and memory configured to store a plurality of first differential profiles and a plurality of second differential profiles converted from the plurality of first profiles and the plurality of second profiles, respectively, at a plurality of cycles, wherein the control unit is configured to:

determine a respective first target peak for each of the plurality of first differential profiles stored in the memory;

diagnose a third indication of the state of the battery based on a change of voltage of the plurality of determined first target peaks at each cycle;

determine a respective second target peak for each of the plurality of second differential profiles stored in the memory;

diagnose a fourth indication of the state of the battery based on a change of voltage and a change of differential capacity of the plurality of determined second target peaks at each cycle; and diagnose a degradation accelerated state of the battery based on at least one of the diagnosed third indication or the diagnosed fourth indication.

8. The apparatus for diagnosing a state of a battery according to claim 7, wherein the control unit is configured to:

diagnose the third indication of the state of the battery as a pending state or a negative electrode degradation accelerated state, and diagnose the fourth indication of the state of the battery as any one of a normal state, a positive electrode degradation accelerated state or the negative electrode degradation accelerated state.

9. The apparatus for diagnosing a state of a battery according to claim 8, wherein the control unit is configured to:

diagnose the third indication of the state of the battery as the negative electrode degradation accelerated state, in response to a voltage at each of the plurality of first target peaks increasing.

10. The apparatus for diagnosing a state of a battery according to claim 8,
wherein the control unit is configured to:
diagnose the fourth indication of the state of the battery of the battery, in response to the diagnosed third indication of the state of the battery being the pending state.

11. The apparatus for diagnosing a state of a battery according to claim 10,
wherein the control unit is configured to:
diagnose the fourth indication of the state of the battery as the negative electrode degradation accelerated state, in response to a voltage value of each of the plurality of second target peaks increasing and the differential capacity value of each of the plurality of second target peaks decreasing, and
diagnose the fourth indication of the state of the battery as the positive electrode degradation accelerated state, in response to the voltage value of each of the plurality of second target peaks decreasing and the differential capacity value of each of the plurality of second target peaks increasing.

12. A method for diagnosing a state of a battery, comprising:
obtaining a first profile for voltage and capacity of the battery while the battery is being charged;
obtaining a second profile for voltage and capacity of the battery while the battery is being discharged;
converting the first profile into a first differential profile for voltage and differential capacity of the battery;
converting the second profile into a second differential profile for voltage and differential capacity of the battery;
determining a first target peak from among a plurality of peaks included in the first differential profile;
diagnosing a first indication of the state of the battery as a pending state or a negative electrode degraded state, according to a first comparison result between the determined first target peak and a preset first reference peak;
determining a second target peak among a plurality of peaks included in the second differential profile;
diagnosing a second indication of the state of the battery as any one of a normal state, a positive electrode degraded state or a negative electrode degraded state, according to a second comparison result between the determined second target peak and a preset second reference peak; and diagnosing the state of the battery by using at least one of the diagnosed first indication of the state of the battery and the diagnosed second indication of the state of the battery.

13. A method for diagnosing a state of a battery, comprising:
obtaining a first profile for voltage and capacity of the battery while the battery is being charged;
obtaining a second profile for voltage and capacity of the battery while the battery is being discharged;
converting the first profile into a first differential profile for voltage and differential capacity of the battery;
converting the second profile into a second differential profile for voltage and differential capacity of the battery;
determining a first target peak from among a plurality of peaks included in the first differential profile;
diagnosing a first indication of the state of the battery according to a first comparison result between the determined first target peak and a preset first reference peak;
determining a second target peak among a plurality of peaks included in the second differential profile;
diagnosing a second indication of the state of the battery according to a second comparison result between the determined second target peak and a preset second reference peak;
diagnosing the state of the battery by using at least one of the diagnosed first indication of the state of the battery and the diagnosed second indication of the state of the battery;
determining a respective first target peak for each of the plurality of first differential profiles converted from the plurality of first profiles at a plurality of cycles;
diagnosing a third indication of the state of the battery based on a change of voltage of the plurality of determined first target peaks at each cycle;
determining a respective second target peak for each of the plurality of second differential profiles converted from the plurality of second profiles at the plurality of cycles;
diagnosing a fourth indication of the state of the battery based on a change of voltage and a change of differential capacity of the plurality of determined second target peaks at each cycle; and
diagnosing a degradation accelerated state of the battery based on at least one of the diagnosed third indication or the diagnosed fourth indication.

* * * * *